US011297724B2

United States Patent
Kim et al.

(10) Patent No.: US 11,297,724 B2
(45) Date of Patent: Apr. 5, 2022

(54) ELECTRONIC DEVICE INCLUDING BATTERY

(71) Applicant: Samsung Electronics Co., Ltd., Gyeonggi-do (KR)

(72) Inventors: Sunghun Kim, Gyeonggi-do (KR); Changyong Seo, Gyeonggi-do (KR); Seungchul Baek, Gyeonggi-do (KR)

(73) Assignee: Samsung Electronics Co., Ltd

( * ) Notice: Subject to any disclaimer, the term of this patent is extended or adjusted under 35 U.S.C. 154(b) by 242 days.

(21) Appl. No.: 16/795,233

(22) Filed: Feb. 19, 2020

(65) Prior Publication Data
US 2020/0267849 A1    Aug. 20, 2020

(30) Foreign Application Priority Data

Feb. 19, 2019   (KR) .......................... 10-2019-0019307

(51) Int. Cl.
*H05K 5/00*     (2006.01)
*H04M 1/02*     (2006.01)
(Continued)

(52) U.S. Cl.
CPC ......... *H05K 5/0017* (2013.01); *H04B 1/3888* (2013.01); *H05K 1/028* (2013.01);
(Continued)

(58) Field of Classification Search
None
See application file for complete search history.

(56) References Cited

U.S. PATENT DOCUMENTS 8,947,863 B2 *  2/2015  Imamura ............... G06F 1/1692
                                                361/679.04
10,834,814 B2 * 11/2020  Cho .................... H04M 1/0247
(Continued)

FOREIGN PATENT DOCUMENTS

JP        2014068153       4/2014
KR     1020150099383       8/2015
(Continued)

OTHER PUBLICATIONS

International Search Report dated Jun. 10, 2020 issued in counterpart application No. PCT/KR2020/002351, 8 pages.

*Primary Examiner* — Xanthia C Cunningham
(74) *Attorney, Agent, or Firm* — The Farrell Law Firm, P.C.

(57) ABSTRACT

An electronic device is provided, including a foldable housing including first and second housing structures; a hinge structure disposed between the first housing structure and the second housing structure and configured to fold or unfold the first housing structure and the second housing structure; a flexible display exposed through at least a portion of a first surface of the foldable housing; a battery disposed inside the second housing structure wherein a partial surface thereof is adjacent to the hinge structure; and a battery plate disposed between the battery and the flexible display, wherein the battery plate includes: a first surface parallel to the first surface of the foldable housing; a first fastening part aligned with the first surface of the battery plate and coupled to a first surface of the second housing structure; a second surface perpendicular to the first surface of the battery plate and adjacent to the hinge structure; and a second fastening part perpendicular to the second surface of the battery plate and coupled to a second surface of the (Continued)

second housing structure opposite to the first surface of the second housing structure.

20 Claims, 17 Drawing Sheets

(51) Int. Cl.
　　*H05K 5/02*　　　　(2006.01)
　　*H05K 1/02*　　　　(2006.01)
　　*H04B 1/3888*　　　(2015.01)
　　*H05K 1/11*　　　　(2006.01)
　　*H04M 1/18*　　　　(2006.01)

(52) U.S. Cl.
　　CPC ........... *H05K 1/118* (2013.01); *H05K 5/0226* (2013.01); *H04M 1/185* (2013.01)

(56) References Cited

U.S. PATENT DOCUMENTS

| | | | |
|---|---|---|---|
| 2012/0229686 A1* | 9/2012 | Imamura | G06F 1/1616 |
| | | | 348/333.01 |
| 2016/0285497 A1 | 9/2016 | Roberts et al. | |
| 2018/0196467 A1 | 7/2018 | Watamura et al. | |
| 2018/0324964 A1 | 11/2018 | Yoo et al. | |
| 2019/0036068 A1 | 1/2019 | Kim et al. | |

FOREIGN PATENT DOCUMENTS

| | | |
|---|---|---|
| KR | 20160062633 | 6/2016 |
| KR | 20160115839 | 10/2016 |

* cited by examiner

ELECTRONIC DEVICE INCLUDING BATTERY

CROSS-REFERENCE TO RELATED APPLICATION

This application is based on and claims priority under 35 U.S.C. § 119 to Korean Patent Application No. 10-2019-0019307, filed on Feb. 19, 2019, in the Korean Intellectual Property Office, the disclosure of which is incorporated by reference herein in its entirety.

BACKGROUND

1. Field

The disclose relates to an electronic device including a battery and a coupling structure thereof.

2. Description of Related Art

Recently, with the development of display-related technologies, electronic devices including a flexible display have been developed. The flexible display may not only be used in the form of a flat surface, but also may be used by being deformed (e.g., curved) into a specific form. For example, an electronic device including a flexible display may be implemented in a foldable form that can be folded or unfolded based on at least one folding axis.

Recent electronic devices may provide various functions (e.g., a voice communication function, a short range wireless communication function, a music or video playback function, a photographing function, or a road guidance function). According to the provision of various functions, recent electronic devices have high-capacity batteries mounted therein. In order to secure a space for mounting a high-capacity battery, an electronic device is required to increase the internal space of a housing in which the battery is placed, reduce the thickness of a portion supporting the battery, and secure rigidity for supporting the battery. For example, an electronic device may have a structure in which a plate made of a metal (e.g., stainless use steel (SUS)) material (a battery plate) is attached (e.g., thermocompressed) to the housing.

A sufficient attachment area is required to attach a battery plate to one surface of a housing. For example, a housing to which a battery plate is attached may be required to include a sufficient attachment surface having vertical and/or horizontal symmetry.

However, a foldable electronic device may have difficulty in securing an attachment area for attaching a battery plate, due to a hinge disposed in one region (e.g., the center) of the electronic device. For example, in a foldable electronic device, the width of a housing located between a hinge and a battery may not be sufficient to attach a battery plate. Accordingly, a battery plate of a foldable electronic device may become separated by external impact due to weak adhesive strength (adhesive force) of one region. In addition, when the width of a housing located between a hinge and a battery is increased to secure an attachment area of a battery plate, a battery mounting space is relatively reduced, so that a foldable electronic device may not be able to have a high-capacity battery mounted therein.

The above information is presented as background information only to assist with an understanding of the disclosure. No determination has been made, and no assertion is made, as to whether any of the above might be applicable as prior art with regard to the disclosure.

SUMMARY

An aspect of the present disclosure provides an electronic device for securing a mounting space of a battery by reducing an area and/or space for a coupling (or fastening) of a battery plate, and provides a coupling structure of the battery plate that may maintain adhesive strength.

An aspect of the present disclosure provides an electronic device. The electronic device includes a foldable housing including a first housing structure and a second housing structure; a hinge structure disposed between the first housing structure and the second housing structure and configured to fold or unfold the first housing structure and the second housing structure; a flexible display exposed through at least a portion of a first surface of the foldable housing; a battery disposed inside the second housing structure wherein a partial surface of the second housing structure is adjacent to the hinge structure; and a battery plate disposed between the battery and the flexible display, wherein the battery plate includes a first surface parallel to the first surface of the foldable housing; a first fastening part aligned with the first surface of the battery plate and coupled to a first surface of the second housing structure; a second surface perpendicular to the first surface of the battery plate and adjacent to the hinge structure; and a second fastening part perpendicular to the second surface of the battery plate and coupled to a second surface of the second housing structure opposite to the first surface of the second housing structure.

Another aspect of the present disclosure provides an electronic device. The electronic device includes a foldable housing including a first housing structure and a second housing structure; a hinge structure disposed between the first housing structure and the second housing structure and configured to fold or unfold the first housing structure and the second housing structure; a flexible display exposed through at least a portion of a first surface of the foldable housing; a battery disposed inside the second housing structure wherein a partial surface of the second housing structure is adjacent to the hinge structure; and a battery plate disposed between the battery and the flexible display, wherein the battery plate includes a first surface parallel to the first surface of the foldable housing; a first fastening part aligned with the first surface of the battery plate and coupled to a first surface of the second housing structure; and a second surface perpendicular to the first surface of the battery plate, adjacent to the hinge structure, and coupled to a second surface of the second housing structure perpendicular to the first surface of the second housing structure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Hereinafter, various embodiments of the present disclosure are described with reference to the accompanying drawings. Although the present disclosure describes various embodiments illustrated in the accompanying drawings in detail with reference thereto, the same is not intended for the purpose of limiting the present disclosure to specific forms. For example, it would be apparent to a person skilled in the art to which the present disclosure pertains that the present disclosure may be variously modified.

Figure 1:
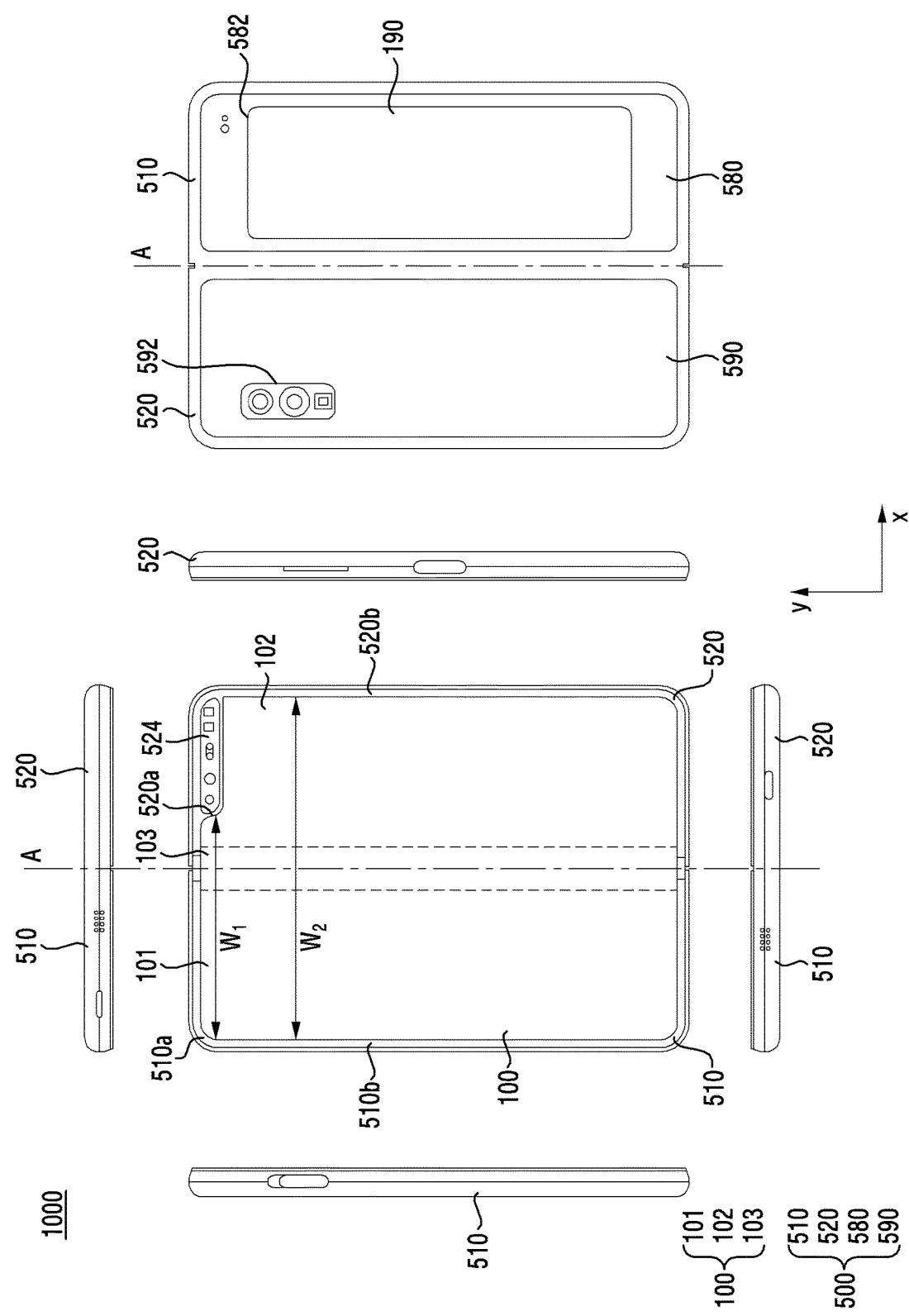
FIG. 1 is an illustration of a flat state of an electronic device according to an embodiment.
Figure 2:
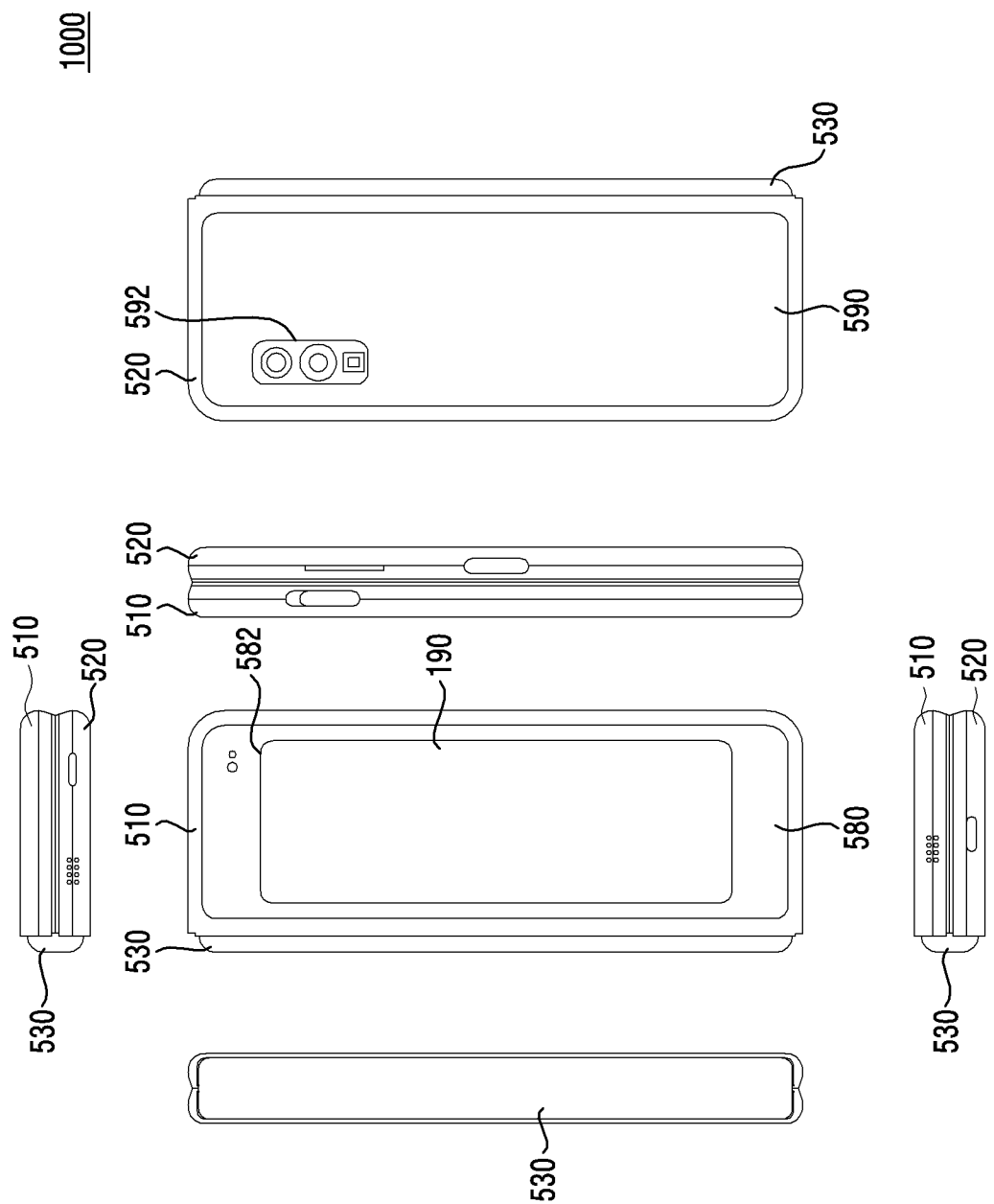
FIG. 2 is an illustration of a folded state of an electronic device according to an embodiment.

FIG. 1 is an illustration of a flat state of an electronic device 1000 according to an embodiment, and FIG. 2 is an illustration of a folded state of the electronic device 1000 according to an embodiment.

Referring to FIGS. 1 and 2, the electronic device 1000 may include a foldable housing 500, a hinge cover 530 covering a foldable portion of the foldable housing 500; and a flexible or foldable display 100 (a display) disposed in a space formed by the foldable housing 500. In the present disclosure, a surface on which the display 100 is disposed may be a first surface or the front surface of the electronic device 1000. Further, a surface opposite to the front surface may be a second surface or the rear surface of the electronic device 1000. In addition, a surface surrounding the space between the front surface and the rear surface may be a third surface or a side surface of the electronic device 1000. The display 100 may include a folding region 103, a first region 101 disposed on one side (the left side of the folding region 103) with reference to the folding region 103, and a second region 102 disposed on the other side (the right side of the folding region 103) with reference to the folding region 103.

The foldable housing 500 may include a first housing structure 510, a second housing structure 520 including a sensor region 524, a first rear cover 580, and a second rear surface 590. The foldable housing 500 of the electronic device 1000 is not intended to be limited to the shape and coupling illustrated in FIGS. 1 and 2, but may be implemented by other shapes or a combination and/or coupling of other components. For example, the first housing structure 510 and the first rear cover 580 may be integrally formed, and the second housing structure 520 and the second rear cover 590 may be integrally formed.

The first housing structure 510 and the second housing structure 520 may be disposed on both sides about a folding axis A and have a shape which is generally symmetrical with respect to the folding axis A. As described below in greater detail, the first housing structure 510 and the second housing structure 520 may have different angles or distances formed thereby according to whether the electronic device 1000 is in a flat state, a folded state, or an intermediate state. The second housing structure 520, unlike the first housing structure 510, may further include the sensor region 524 in which various sensors are disposed, but in other regions, the first housing structure 510 and the second housing structure 520 may have mutually symmetrical shapes.

The first housing structure 510 and the second housing structure 520 may, together, form a recess for receiving the display 100. Due to the sensor region 524, the recess may have two or more widths different from each other in a direction perpendicular to the folding axis A.

For example, the recess may have (1) a first width w1 between a first portion 510a parallel to the folding axis A of the first housing structure 510 and a first portion 520a formed at an edge of the sensor region 524 of the second housing structure 520, and (2) a second width w2 formed by a second portion 510b of the first housing structure 510 and a second portion 520b of the second housing structure 520, wherein the second portion does not correspond to the sensor region 524 and is parallel to the folding axis A. In this case, the second width w2 may be longer than the first width w1. In other words, the first portion 510a of the first housing structure 510 and the first portion 520a of the second housing structure 520 which have mutually asymmetrical shapes may form the first width w1 of the recess, and the second portion 510b of the first housing structure 510 and the second portion 520b of the second housing structure 520 which have mutually symmetrical shapes may form the second width w2 of the recess. The first portion 520a and the second portion 520b of the second housing structure 520 may have different distances from the folding axis A. The width of the recess is not limited to the illustrated example. The recess may have a plurality of widths by a shape of the sensor region 524 or a portion in which the first housing structure 510 and the second housing structure 520 have asymmetrical shapes.

At least a portion of the first housing structure 510 and the second housing structure 520 may be formed of a metal material or a non-metal material having rigidity having a size selected to support the display 100.

The sensor region 524 may be formed adjacent to one corner of the second housing structure 520 to have a certain region. However, an arrangement, a shape, and a size of the sensor region 524 are not intended to be limited to the illustrated example. For example, the sensor region 524 may be provided in another corner of the second housing structure 520 or in a region between the upper end corner and the lower end corner. Components for performing various functions embedded in the electronic device 1000 may be exposed on the front surface of the electronic device 1000 through the sensor region 524 or through one or more openings provided in the sensor region 524. The components may include various types of sensors. The sensors may include, for example, at least one of a front camera, a receiver, or a proximity sensor.

The first rear cover 580 may be disposed on one side of the folding axis A on the rear surface of the electronic device 1000, and may have, for example, a substantially rectangular edge. The edge may be covered by the first housing structure 510. Similarly, the second rear cover 590 may be disposed on the other side of the folding axis A of the rear surface of the electronic device 1000, and an edge of the second rear cover may be covered by the second housing structure 520.

The first rear cover 580 and the second rear cover 590 may have substantially symmetrical shapes about the folding axis A. However, the first rear cover 580 and the second rear cover 590 do not necessarily have mutually symmetrical shapes, and the electronic device 1000 may include the first rear cover 580 and the second rear cover 590 having various shapes. The first rear cover 580 may be integrally formed with the first housing structure 510, and the second rear cover 590 may be integrally formed with the second housing structure 520.

The first rear cover 580, the second rear cover 590, the first housing structure 510, and the second housing structure 520 may form a space in which various components (e.g., a printed circuit board or a battery) of the electronic device 1000 are arranged. At least one component may be disposed or visually exposed on the rear surface of the electronic device 1000. For example, at least a portion of a sub display 190 may be visually exposed through a first rear region 582 of the first rear cover 580. At least one component or sensor may be visually exposed through a second rear region 592 of the second rear cover 590. The sensor may include a proximity sensor and/or a rear camera.

Referring to FIG. 2, the hinge cover 530 may be disposed between the first housing structure 510 and the second housing structure 520 and configured to hide an internal component (e.g., a hinge structure). The hinge cover 530 may be hidden by a portion of the first housing structure 510 and the second housing structure 520 or exposed to the outside, according to a state (e.g., a flat state or a folded state) of the electronic device 1000.

For example, as illustrated in FIG. 1, when the electronic device 1000 is in a flat state, the hinge cover 530 may be hidden by the first housing structure 510 and the second housing structure 520 so as not to be exposed. For example, as illustrated in FIG. 2, when the electronic device 1000 is in a folded state (e.g., a fully folded state), the hinge cover 530 may be exposed to the outside between the first housing structure 510 and the second housing structure 520. For example, when the first housing structure 510 and the second housing structure 520 are in an intermediate state in which the first and the second housing make a certain angle with respect to each other, the hinge cover 530 may be partially exposed to the outside between the first housing structure 510 and the second housing structure 520. However, in this case, the exposed region may be less than that in the fully folded state. The hinge cover 530 may include a curved surface.

The display 100 may be disposed in a space formed by the foldable housing 500. For example, the display 100 may be placed in a recess formed by the foldable housing 500 and may configure most of the front surface of the electronic device 1000.

Accordingly, the front surface of the electronic device 1000 may include the display 100, a partial region of the first housing structure 510, and a partial region of the second housing structure 520, the partial regions being adjacent to the display 100. Further, the rear surface of the electronic device 1000 may include the first rear cover 580, a partial region of the first housing structure 510 adjacent to the first rear cover 580, the second rear cover 590, and a partial portion of the second housing structure 520 adjacent to the second rear cover 590.

The display 100 may refer to a display in which an at least partial region may be transformed into a flat or curved surface. The display 100 may include a folding region 103, a first region 101 disposed on one side (the left side of the folding region 103) with reference to the folding region 103, and a second region 102 disposed on the other side (the right side of the folding region 103) with reference to the folding region.

The region division of the display 100 illustrated in FIG. 1 is exemplary, and the display 100 may be divided into a plurality of regions (e.g., four or more, or two) according to a structure or a function. For example, as illustrated in FIG. 1, a region of the display 100 may be divided by the folding axis A or the folding region 103 extending in parallel to a y axis. However, the region of the display 100 may be divided with reference to another folding region (e.g., a folding region parallel to an x axis) or another folding axis (e.g., a folding axis parallel to the x axis).

The first region 101 and the second region 102 may have a generally symmetrical shape with respect to the folding region 103. However, unlike the first region 101, the second region 102 may include a notch cut according to the presence of the sensor region 524, but in other regions, the second region 102 may have a symmetrical shape with the first region 101. In other words, the first region 101 and the second region 102 may include a portion in which the first region and the second region have mutually symmetrical shapes and a portion in which the first region and the second region have mutually asymmetrical shapes.

Hereinafter, each region of the display 100 and the operation of the first housing structure 510 and the second housing structure 520 according to a state of the electronic device 1000 (e.g., a flat state or a folded state) are described.

When the electronic device 1000 is in a flat state (e.g., as illustrated in FIG. 1), the first housing structure 510 and the second housing structure 520 may be arranged to face the same direction at an angle of 180 degrees. A surface of the first region 101 and a surface of the second region 102 of the display 100 may form an angle of 180 degrees with each other, and face the same direction (e.g., the front direction of the electronic device 1000). The folding region 103 may form the same plane as the first region 101 and the second region 102.

When the electronic device 1000 is in a folded state (e.g., as illustrated in FIG. 2), the first housing structure 510 and the second housing structure 520 may be arranged to face each other. The surface of the first region 101 and the surface of the second region 102 of the display 100 may form a narrow angle (e.g., between 0 degrees and 10 degrees) with each other, and face each other. At least a portion of the folding region 103 may be formed of a curved surface having a certain curvature.

When the electronic device 1000 is in an intermediate state, the first housing structure 510 and the second housing structure 520 may be arranged at a certain angle to each other. The surface of the first region 101 and the surface of the second region 102 of the display 100 may form an angle greater than that in the folded state (e.g., as illustrated in FIG. 2) and less than that in the flat state. At least a portion of the folding region 103 may be formed of a curved surface having a certain curvature, and the curvature may be less than that in the folded state.

Figure 3:
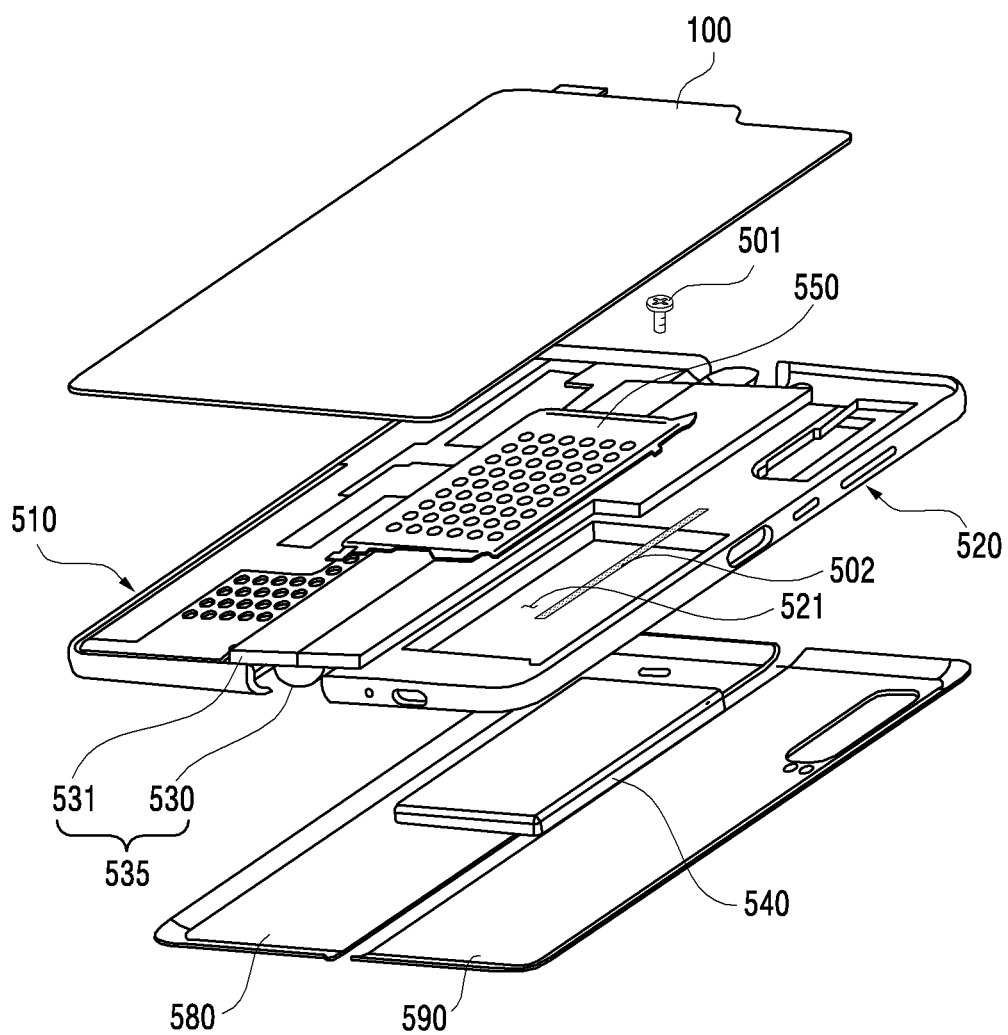
FIG. 3 is an exploded perspective view of an electronic device according to an embodiment.

FIG. 3 is an exploded perspective view of the electronic device 1000 according to an embodiment.

Referring to FIG. 3, the electronic device 1000 may include the display 100, the first housing structure 510, the second housing structure 520, a hinge housing structure 535, a battery 540, a battery plate 550, the first rear cover 580, and the second rear cover 590.

In order to avoid redundant description, the descriptions above of the display 100, the first rear cover 580, and the second rear cover 590 are omitted here.

In a state where the display 100 is coupled to the hinge housing structure 535, the first housing structure 510 and the second housing structure 520 may be coupled to both sides of the hinge housing structure 535 and assembled with each other, and rotated about a folding axis A to be folded or unfolded. The second housing structure 520 may include a hole 521 in which the battery 540 is inserted. The hole 521 in which the battery 540 is inserted may be formed in the first housing structure 510. Alternatively, when the electronic device 1000 includes two batteries, the hole 521 may be formed in both the first housing structure 510 and the second housing structure 520.

The hinge housing structure 535 may include a hinge structure 531 and the hinge cover 530 which covers the hinge structure 531 such that the hinge structure 531 is not visible from the outside.

The battery 540 may provide a power source for operation (driving) of the electronic device 1000. The battery 540 may be a rechargeable secondary battery. The battery 540 may be disposed between the display 100 and the second rear cover 590. The battery 540 may be disposed adjacent to the hinge housing structure 535. This is because the hole 521 of the second housing structure 520 may be formed to be adjacent to the hinge housing structure 535 in order to mount the high-capacity battery 540 therein.

The battery plate 550 may be disposed between the display 100 and the battery 540. The battery plate 550 may be coupled to the second housing structure 520 by various fastening means (e.g., a screw, adhesive tape, welding, etc.). For example, a partial region of the battery plate 550 may be coupled to a first surface of the second housing structure 520 by a screw 501 and/or adhesive tape 502, and another partial region of the battery plate 550 may be coupled to a second surface (the rear surface) and/or a third surface (a side surface) of the second housing structure 520. A detailed description of a coupling structure of the battery plate 550 is described below in greater detail with reference to FIGS. 7 to 15.

The electronic device 1000 may further include a substrate part on which various components for implementing various functions of the electronic device 1000 are mounted. The substrate part may include a first substrate disposed on the side of the first housing structure 510, and a second substrate disposed on the side of the second housing structure 520.

Figure 4A:
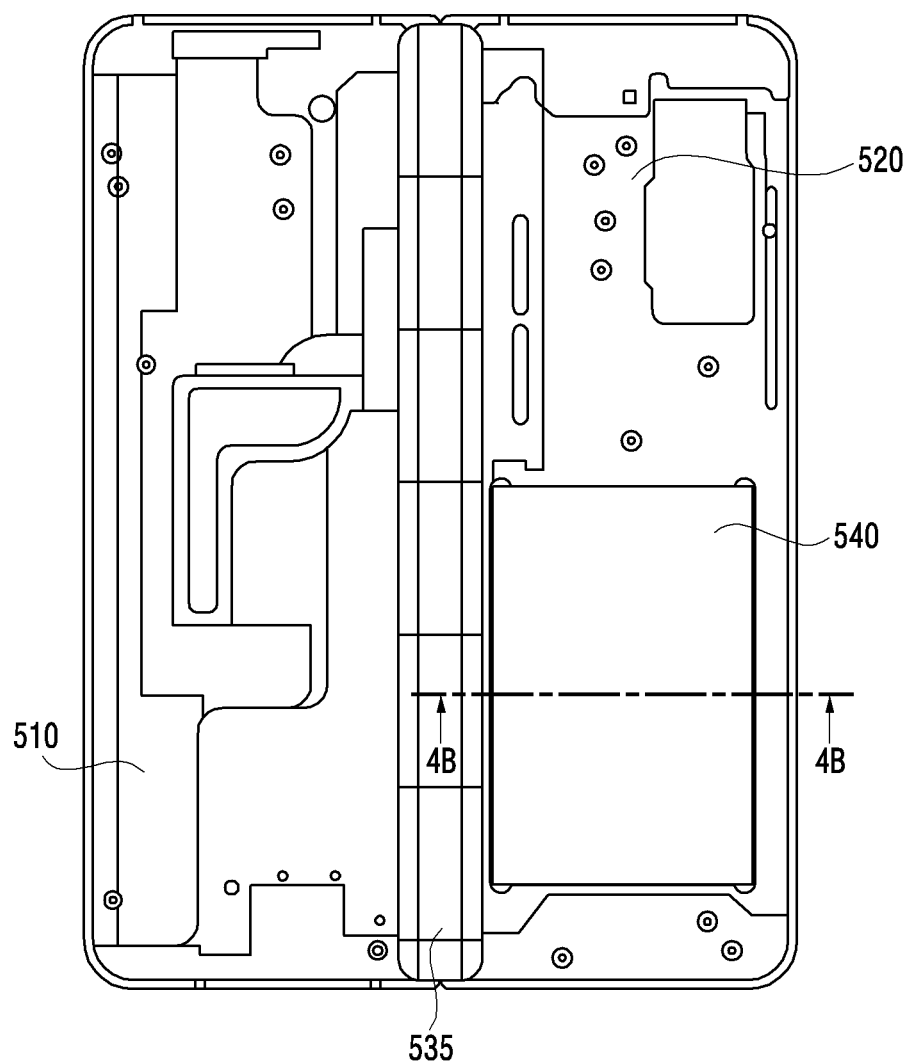
FIG. 4A is an illustration of an electronic device without rear covers thereof according to an embodiment.
Figure 4B:
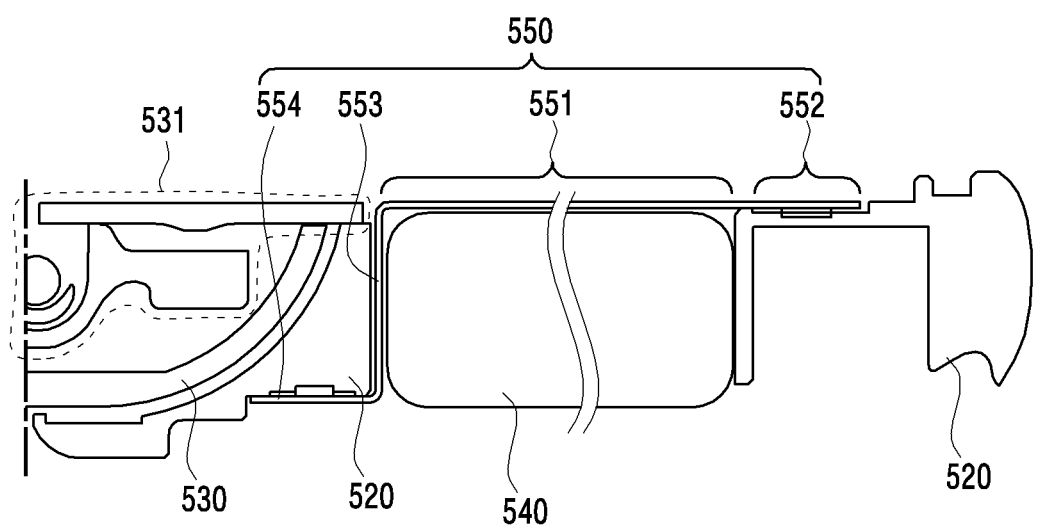
FIG. 4B is a cross-sectional view taken along line 4B-4B of FIG. 4A according to an embodiment.
Figure 4C:
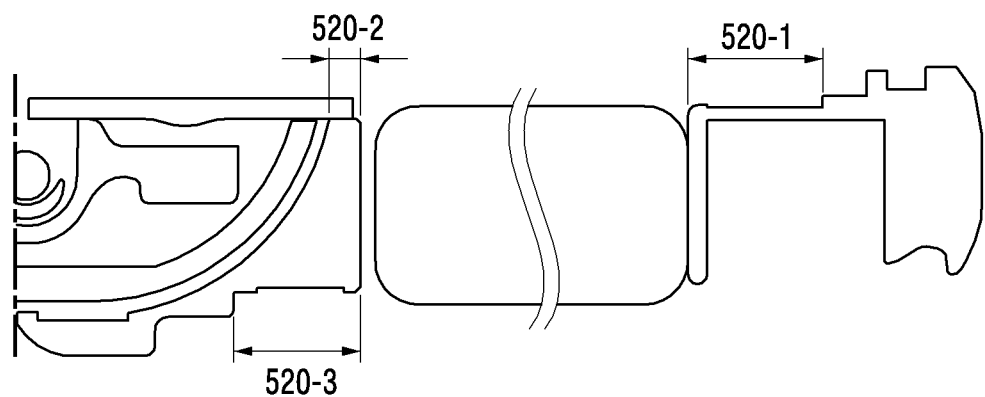
FIG. 4C is an illustration of an adhesive area of a battery plate according to an embodiment.

FIG. 4A is an illustration of the electronic device 1000 without rear covers thereof according to an embodiment, FIG. 4B is a cross-sectional view taken along line 4B-4B of FIG. 4A, and FIG. 4C is an illustration of an adhesive area of the battery plate 550 according to an embodiment.

Referring to FIGS. 4A, 4B, and 4C, the electronic device 1000 may include the battery 540 therein. For example, the battery 540 may be located in a space formed in the second housing structure 520 and the battery plate 550.

The hinge housing structure 535 may be located (disposed) in one region of the second housing structure 520 (e.g., a region adjacent to the hinge housing structure 535). One region of the second housing structure 520 may have a curved shape in order to mount the hinge cover 530 therein. Accordingly, the second housing structure 520, as illustrated in FIG. 4C, may have different widths of a right side 520-1 (a (1-1)th surface) of the first surface thereof and a left side 520-2 (a (1-2)th surface) of the first surface thereof. In addition, the width of the (1-2)th surface 520-2 of the second housing structure 520 may be narrower than the width of a second surface 520-3. Thus, due to the narrow width of the (1-2)th surface 520-2, it may be difficult for the battery plate 550 to be coupled (e.g., bonded) to the (1-2)th surface 520-2, and the battery plate 550 may have a weak coupling strength even when the battery plate 550 is coupled to the (1-2)th surface.

A first surface 551 of the battery plate 550 may support (or cover) the battery 540, a first fastening part 552 thereof may be coupled to the (1-1)th surface 520-1 of the second housing structure 520, and a second surface 553 and a second fastening part 554 thereof may be bent in a "Z" shape to be coupled to the second surface 520-3 of the second housing structure 520. For example, since the (1-1)th surface 520-1 of the second housing structure 520 has a sufficient area to bond the battery plate 550 to have certain strength or more, another partial region 552 of the battery plate 550 may be coupled (e.g., thermocompressed) to the (1-1)th surface 520-1 of the second housing structure 520, as illustrated in FIG. 4B. In addition, since the (1-2)th surface 520-2 of the second housing structure 520 does not have a sufficient area to bond the battery plate 550 and the second surface 520-3 has a sufficient area to bond the battery plate 550, a partial region (e.g., the second surface 553 and the second fastening part 554) of the battery plate 550 may be bent in a "Z" shape to be coupled to the second surface 520-3 of the second housing structure 520.

The battery plate 550 is made of a metal material and has a very thin thickness, and, thus, even when the second surface 553 is positioned between the second housing structure 520 and the battery 540, a mounting space for the battery 540 may be prevented from being reduced. In addition, the second surface 553 of the battery plate 550 covers the battery 540, and, thus, the battery 540 may be prevented from colliding with another configuration (e.g., the hinge structure 531) in the electronic device 1000 by external impact.

FIGS. 4A, 4B, and 4C illustrate that the battery 540 is disposed in the second housing structure 520. However, the battery 540 may be disposed in the first housing structure 510. Alternatively, the battery 540 may be disposed in each of the first housing structure 510 and the second housing structure 520.

Figure 5:
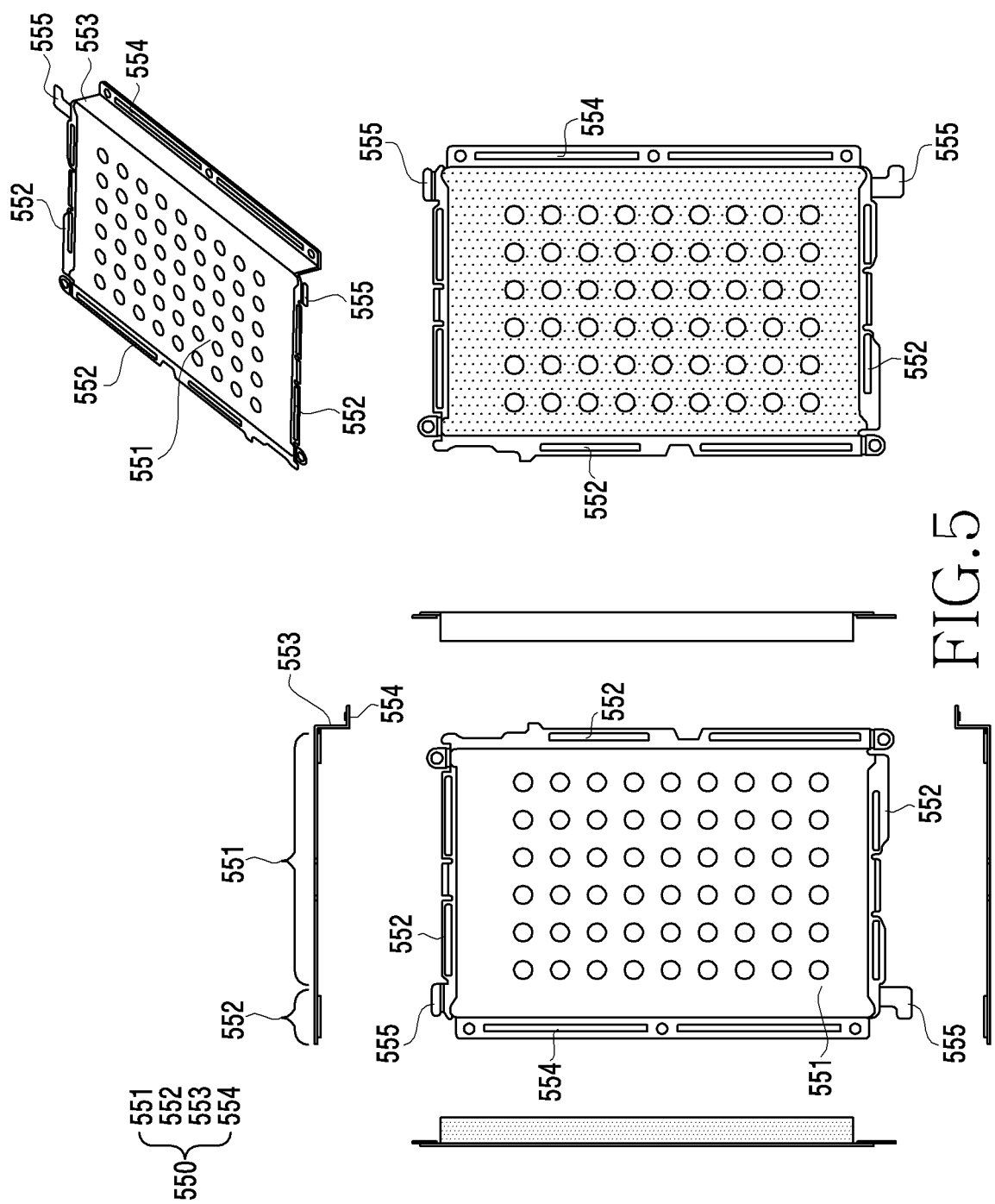
FIG. 5 is an illustration of a battery plate according to an embodiment.
Figure 6:
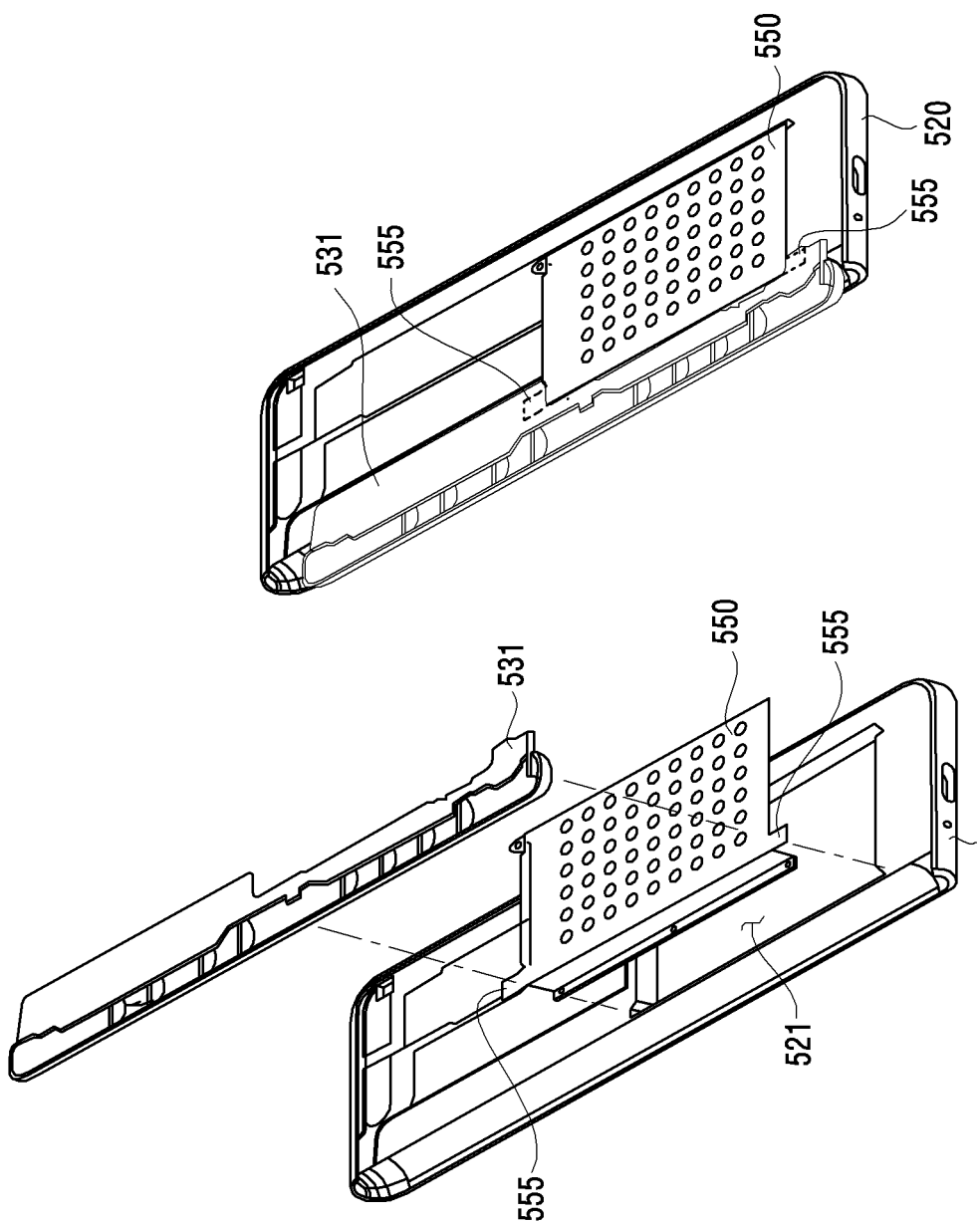
FIG. 6 is an illustration of a structure in which a battery plate is coupled to a second housing structure according to an embodiment.

FIG. 5 is an illustration of the battery plate 550 according to an embodiment, and FIG. 6 is an illustration of a structure in which the battery plate 550 is coupled to the second housing structure 520 according to an embodiment.

Referring to FIGS. 5 and 6, the battery plate 550 may generally have a shape (e.g., a rectangular shape) corresponding to the battery 540. As illustrated in FIG. 6, the battery plate 550 may be inserted in and coupled to the hole 521 formed in the second housing structure 520 to form a mounting space for the battery 540.

The battery plate 550 may include a first surface (or a support part) 551 parallel to a first surface of the foldable housing 500 and supporting the battery 540; at least one first fastening part 552 extending to be aligned with the first surface 551 from a portion of the edges of the first surface 551; a second surface (or a bending part) 553 extending from one of the edges of the first surface 551 (e.g., an edge adjacent to the hinge structure 531) to be perpendicular to the first surface 551; and a second fastening part 554 extending from the second surface 553 to be perpendicular thereto.

The first surface 551 may include a plurality of holes for dissipating heat generated from the battery 540. The first fastening part 552 may be coupled to the (1-1)th surface 520-1 of the second housing structure 520. A coupling structure of the first fastening part 552 is described below in greater detail with reference to FIGS. 7 and 9 to 12.

The second surface 553 may be bent and formed to be perpendicular to the first surface 551 from an edge adjacent to the hinge housing structure 535 among the edges of the first surface 551. The second surface 553 may have a height similar to a thickness of the battery 540. The second surface 553 may be bent to cover a partial region of the battery 540 to protect the battery 540 from external impact. For example, the second surface 553 may be disposed between the hinge structure 531 and the battery 540 to prevent the hinge structure 531 from directly impacting the battery 540.

The second fastening part 554 may be perpendicular to the second surface 553 and parallel to the first surface 551. The second fastening part 554 may be fastened to the second surface 520-3 of the second housing structure 520. A coupling structure of the second fastening part 554 is described below in greater detail with reference to FIGS. 8, 10, and 11.

As illustrated in FIG. 6, a partial region 555 of the battery plate 550 may overlap the hinge structure 531 when the hinge structure 531 is coupled to the second housing structure 520. A coupling structure in which the hinge structure 531 and the second housing structure 520 overlap each other is described below in greater detail with reference to FIGS. 7 and 12.

Figure 7:
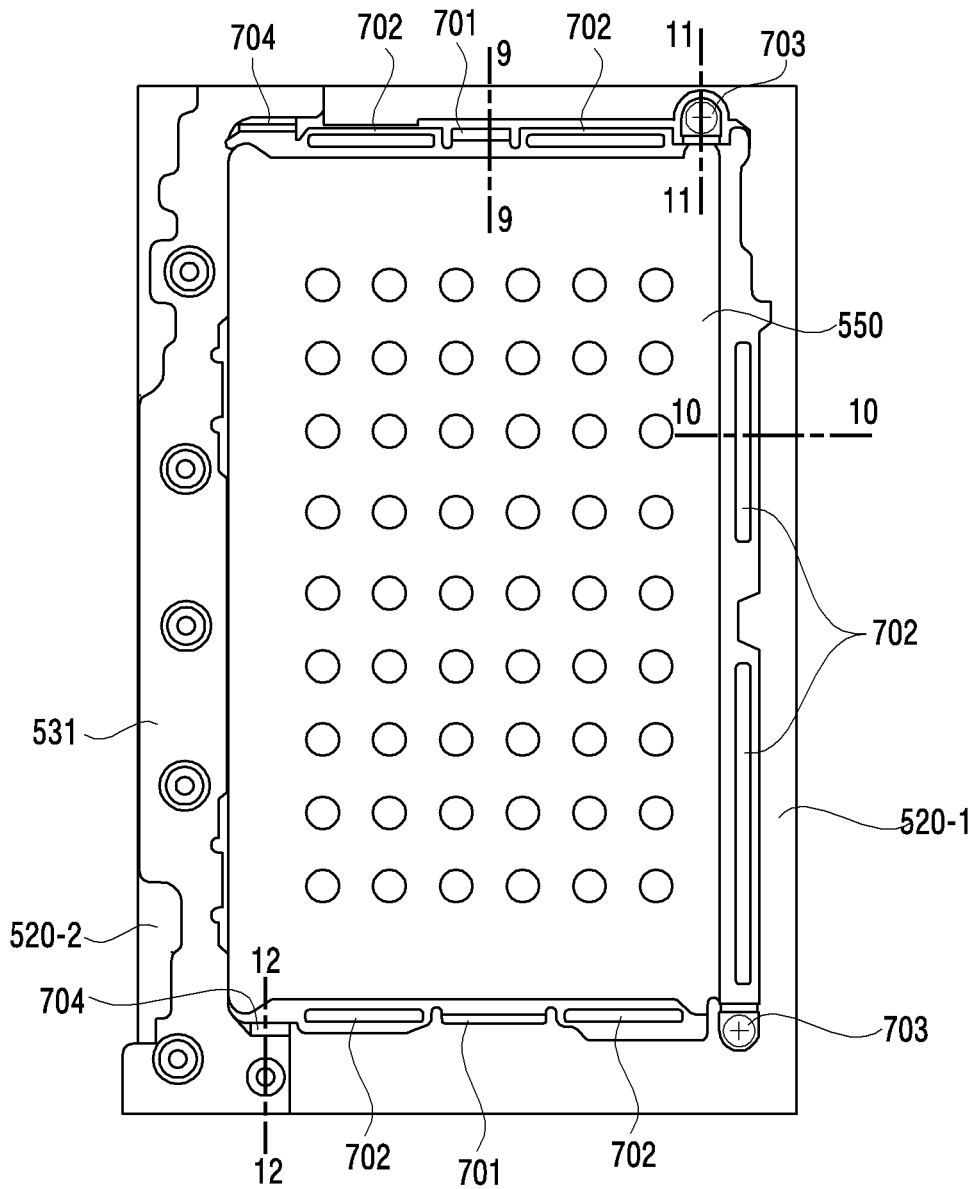
FIG. 7 is an illustration of a structure in which a battery plate is coupled to a first surface of a second housing structure according to an embodiment.
Figure 8:
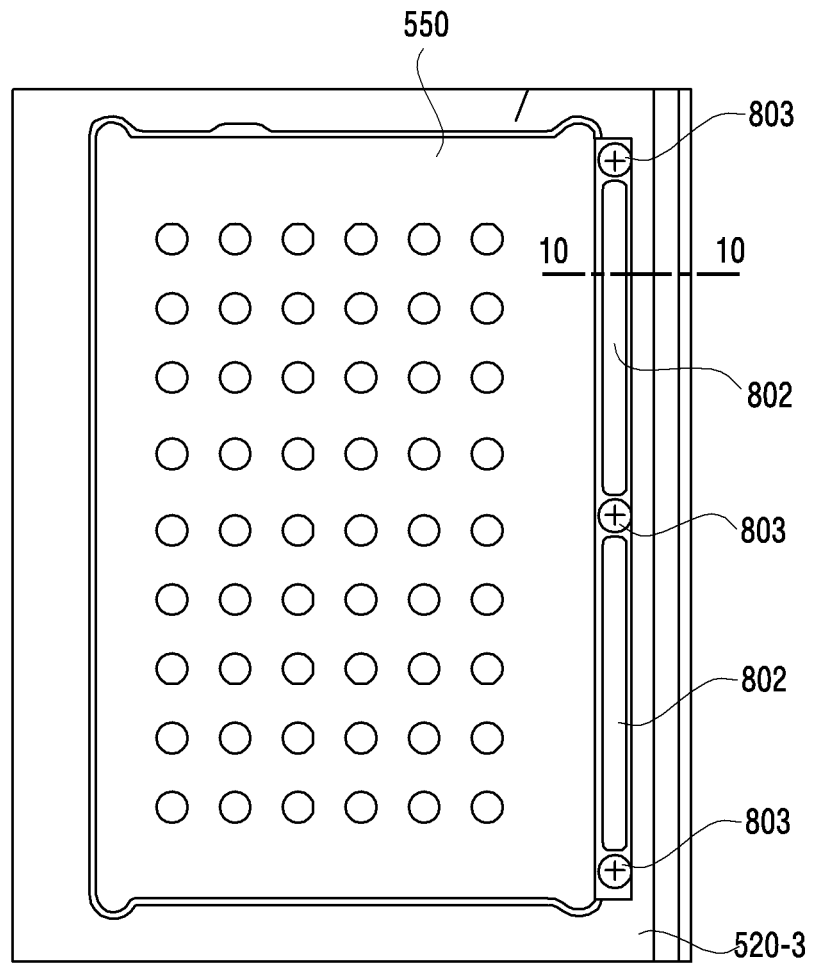
FIG. 8 is an illustration of a structure in which a battery plate is coupled to a second surface of a second housing structure according to an embodiment.
Figure 9:
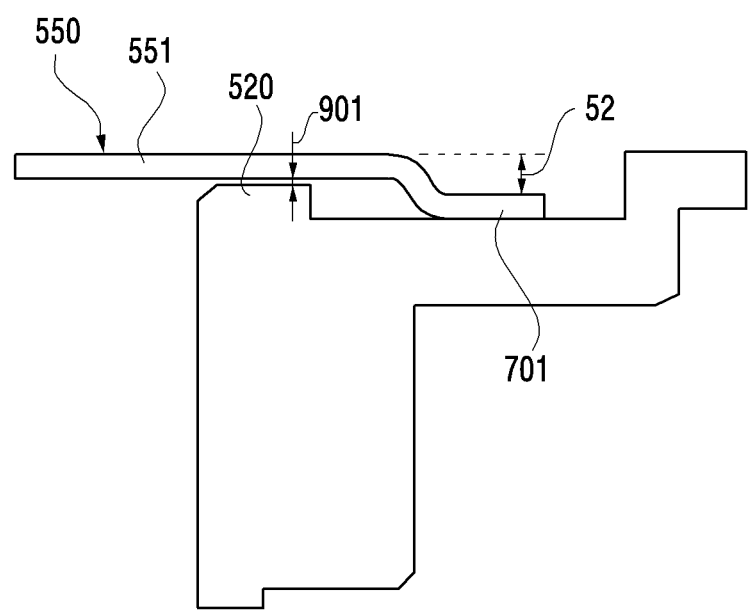
FIG. 9 is an illustration of a welding structure of a battery plate according to an embodiment.
Figure 10:
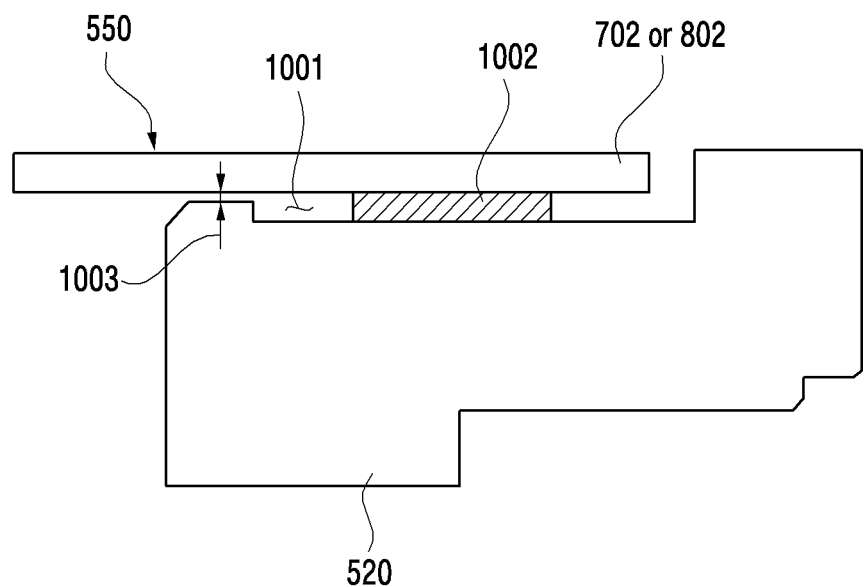
FIG. 10 is an illustration of an adhesive structure of a battery plate according to an embodiment.
Figure 11:
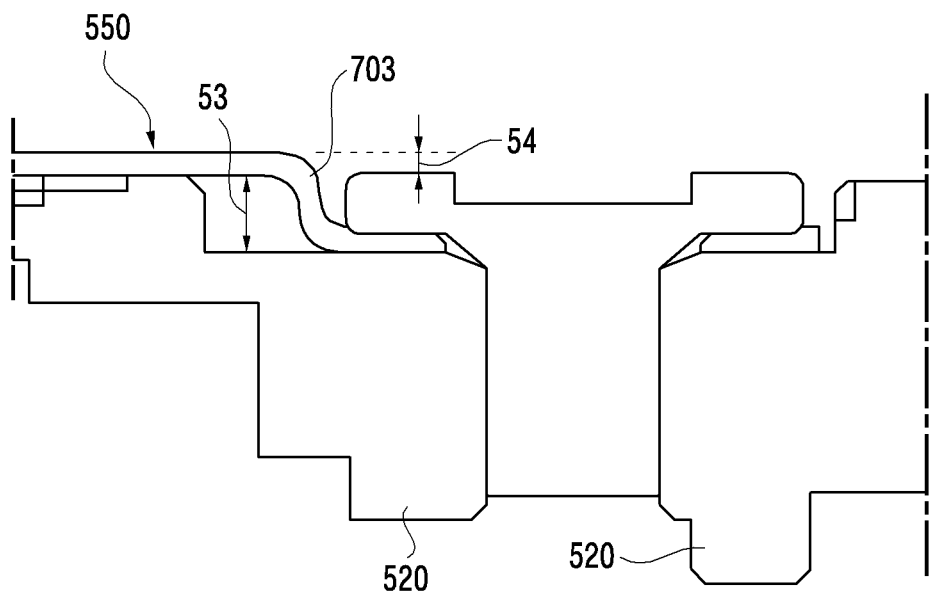
FIG. 11 is an illustration of a screw fastening structure of a battery plate according to an embodiment.
Figure 12:
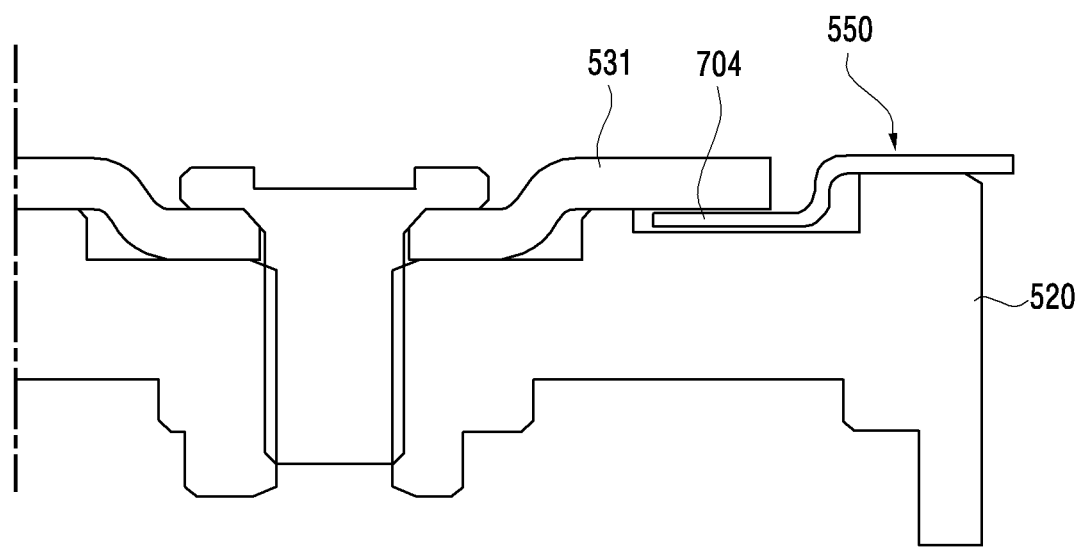
FIG. 12 is an illustration of a covering structure of a battery plate according to an embodiment.

FIG. 7 is an illustration of a structure in which the battery plate 550 is coupled to the first surface 520-1 and 520-2 of the second housing structure 520 according to an embodiment, FIG. 8 illustrates a structure in which the battery plate 550 is coupled to the second surface 520-3 of the second housing structure 520 according to an embodiment, FIG. 9 illustrates a welding structure of the battery plate 550 according to an embodiment, FIG. 10 illustrates an adhesive structure of the battery plate 550 according to an embodiment, FIG. 11 illustrates a screw fastening structure of the battery plate 550 according to an embodiment, and FIG. 12 illustrates a covering structure of the battery plate 550 according to an embodiment.

Referring to FIGS. 7 to 12, the battery plate 550 may be coupled to the second housing structure 520 through various coupling structures in order to prevent separation during impact. For example, as illustrated in FIG. 7, the battery plate 550 may include a welding region 701, an adhesive region 702, a screw fastening region 703, and a covering region 704 to be coupled with the first surface 520-1 and 520-2 of the second housing structure 520. In addition, as illustrated in FIG. 8, the battery plate 550 may include an adhesive region 802 and a screw fastening region 803 to be coupled with the second surface 520-3 of the second housing structure 520.

As illustrated in FIG. 7, the welding region 701 may be formed around the center of the upper end and the center of the lower end of the battery plate 550. Through the welding region 701, the battery plate 550 may be electrically connected to the second housing structure 520 made of a metal material.

The welding region 701 of the battery plate 550 may be bent. For example, as illustrated in FIG. 9, the welding region 701 of the battery plate 550 may be bent to have a stepped portion 52 having a predetermined size (e.g., 0.25 T) with the first surface 551. Due to the stepped portion 52, the welding region 701 of the battery plate 550 may not become higher than the first surface 551 even when slag is generated. In addition, in order to prevent the battery 540 from being overpressed, the welding region 701 may be welded to have a gap 901 having a predetermined size (e.g., 0.05 T) between the first surface 551 and the second housing structure 520.

The adhesive regions 702 and 802 may attach the battery plate 550 to the (1-1)th surface 520-1 or the second surface 520-3 of the second housing structure 520 through an adhesive material (e.g., thermocompression tape). For example, as illustrated in FIG. 7, the adhesive region 702 may be formed at the upper end, the lower end, and the right side of the battery plate 550 to attach the battery plate 550 (e.g., a portion of the first fastening part 552) to the (1-1)th surface 520-1 of the second housing structure 520. In addition, as illustrated in FIG. 8, the adhesive region 802 may be formed on the right side (the left side in FIG. 7) of the battery plate 550 to attach the battery plate 550 (e.g., a portion of the second fastening part 554) to the second surface 520-3 of the second housing structure 520.

The adhesive regions 702 and 802 may be attached to an attachment part 1001 of the second housing structure 520 through an adhesive material. As illustrated in FIG. 10, the attachment part 1001 may be a recess having a certain height (e.g., 0.1 T) and formed on the (1-1)th surface 520-1 or the second surface 520-3 of the second housing structure 520.

In a state where an adhesive material 1002 (e.g., thermocompression tape of 0.2 T) thicker than a height of the attachment part 1001 is attached to the attachment part 1001 or the adhesive regions 702 and 802, the adhesive regions 702 and 802 may be compressed up to a height similar to the height of the attachment part 1001 (e.g., the height of the attachment part 1001 (e.g., 0.1 T)+an overpressing prevention gap 1003 (e.g., 0.02 T)) to attach the battery plate 550 to the second housing structure 520.

The screw fastening regions 703 and 803 may be coupled through screws to a location where impact is concentrated. For example, as illustrated in FIG. 7, the screw fastening region 703 may be formed at the upper right corner and the lower right corner of the battery plate 550 where the rear impact is concentrated. In addition, as illustrated in FIG. 8, the screw fastening region 803 may be formed at the upper right corner (in FIG. 7, the upper left corner of the first surface), the right center (in FIG. 7, the left center of the first surface), and the lower right corner (in FIG. 7, the lower left corner of the first surface) of the battery plate 550 where the front impact is concentrated.

The screw fastening region 703 of the battery plate 550 may be bent to have a stepped portion 53 with the first surface 551. The screw fastening region 703 may be fastened to the second housing structure 520 such that a head of a screw has a height lower than the first surface 551 of the battery plate 550, as indicated by reference numeral 54 of FIG. 11.

The covering region 704 may be covered (e.g., inserted) by other configurations (e.g., the hinge structure 531 and the second housing structure 520). For example, as illustrated in FIG. 7, the covering region 704 may be formed on the upper left end and the lower left end of the first surface 551 of the battery plate 550 adjacent to the hinge structure 531 coupled to the second housing structure 520.

As illustrated in FIG. 12, a portion of the screw-fastened hinge structure 531 and a portion of the battery plate 550 (e.g., a portion of the first fastening part 552) overlap each other, so that the covering region 704 can prevent the battery plate 550 from being separated from the second housing structure 520. For example, the covering region 704 may be inserted between the hinge structure 531 and the second housing structure 520, and may be pressed and fixed by a certain force through the screw-fastening of the hinge structure 531.

Application examples of various coupling structures of FIGS. 7 to 12 described above are merely exemplary, but are not intended to limit the present disclosure. Various coupling structure of FIGS. 7 to 12 may be applied to the battery plate 550 in various forms by combining at least one component according to the intention of a designer. For example, the second fastening part 554 of the battery plate 550 may include a welding region welded to the second surface of the second housing structure 520.

Figure 13:
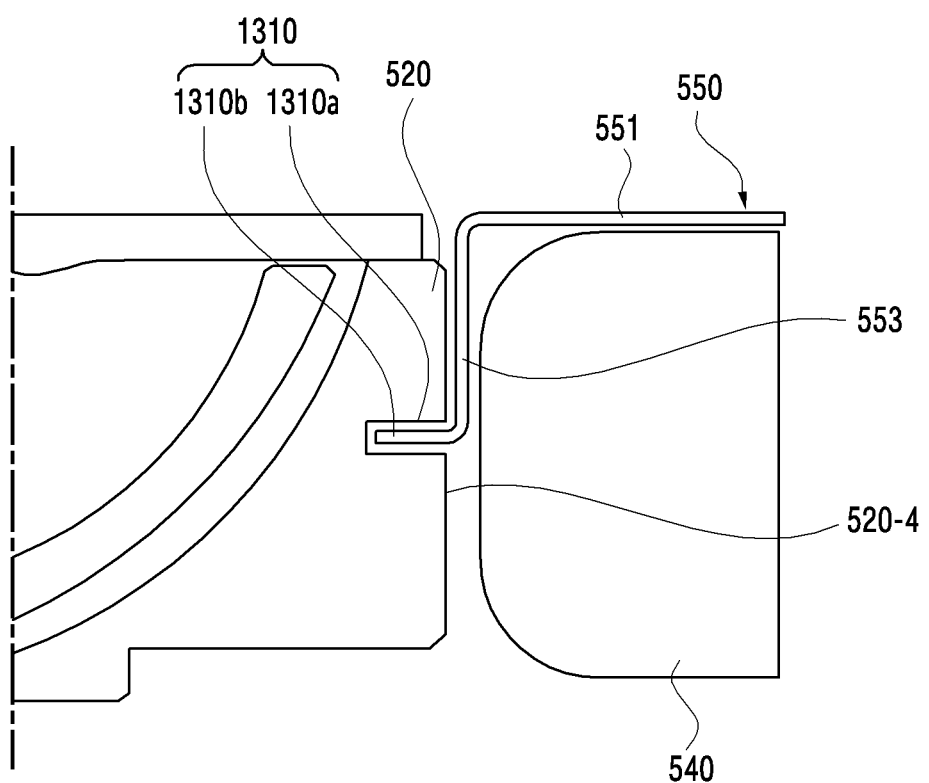
FIG. 13 is an illustration of a structure in which a battery plate is coupled to a second housing structure according to an embodiment.
Figure 14:
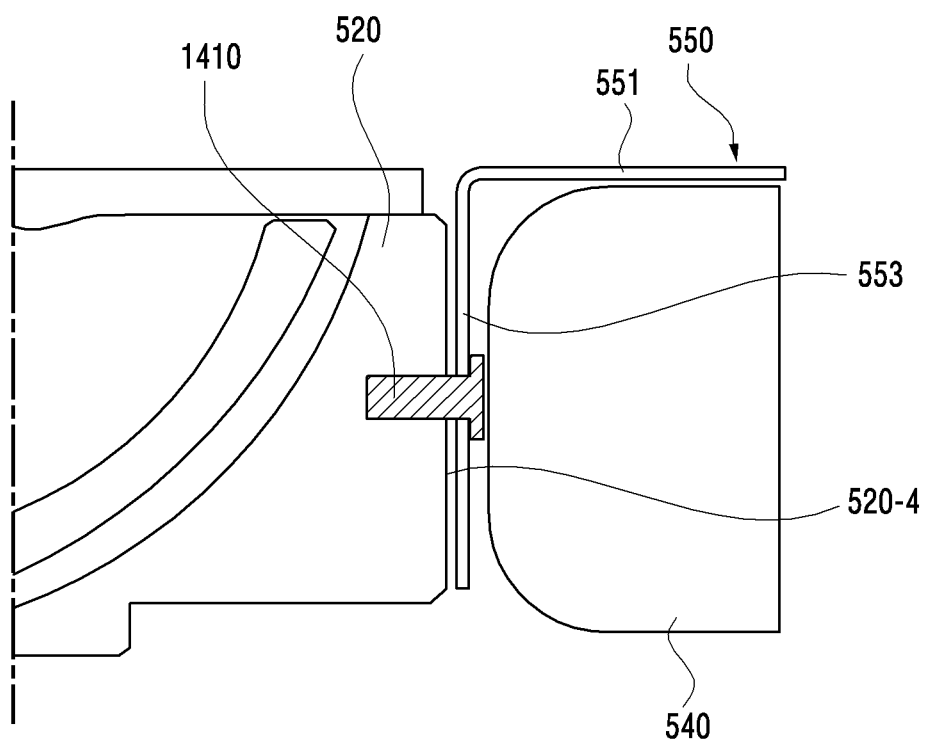
FIG. 14 is an illustration of a structure in which a battery plate is coupled to a second housing structure according to an embodiment.
Figure 15:
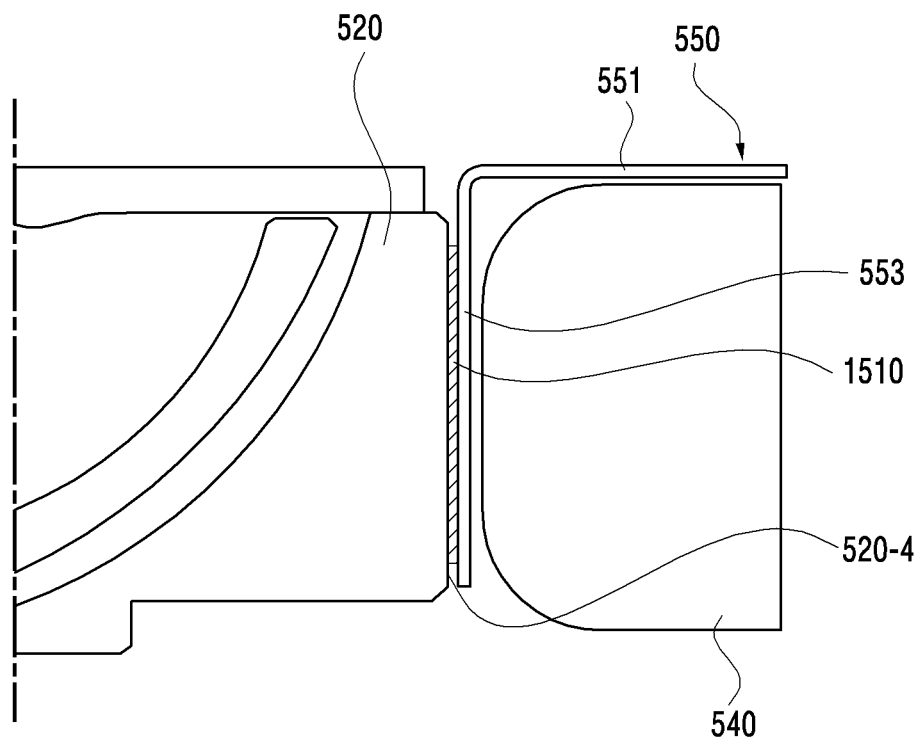
FIG. 15 is an illustration of a structure in which a battery plate is coupled to a second housing structure according to an embodiment.

FIG. 13 is an illustration of a structure in which the battery plate 550 is coupled to the second housing structure 520 according to an embodiment, FIG. 14 is an illustration of a structure in which the battery plate 550 is coupled to the second housing structure 520 according to an embodiment, and FIG. 15 is an illustration of a structure in which the battery plate 550 is coupled to the second housing structure 520 according to an embodiment.

Referring to FIGS. 13, 14, and 15, the second surface 553 of the battery plate 550 perpendicular to the first surface 551 of the battery plate 550 and located between the battery 540 and the second housing structure 520 may be coupled to a third surface 520-4 of the second housing structure 520. For example, as illustrated in FIG. 13, the second surface 553 of the battery plate 550 may be coupled to the third surface 520-4 of the second housing structure 520 by a hook structure 1310. For example, a protrusion (a protruding part) 1310b formed on the second surface 553 is inserted (e.g., interference fitted) in a groove 1310a formed in the third surface 520-4 of the second housing structure 520. The electronic device may include a plurality of hook structures. For example, as illustrated in FIG. 14, the second surface 553 of the battery plate 550 may be coupled to the third surface 520-4 of the second housing structure 520 by a screw fastening structure 1410. The electronic device 1000 may include a plurality of screw fastening structures. For example, as illustrated in FIG. 15, the second surface 553 of the battery plate 550 may be coupled to the third surface 520-4 of the second housing structure 520 by a bonding manner 1510 (e.g., an adhesive material).

The battery plate 550 of FIGS. 13 to 15 may further include the second fastening part 554 coupled to the second surface 520-3 of the second housing structure 520.

According to an embodiment, an electronic device (e.g., the electronic device 1000) may include a foldable housing (e.g., the foldable housing 500) including a first housing structure (e.g., the first housing structure 510) and a second housing structure (e.g., the second housing structure 520); a hinge structure (e.g., the hinge structure 531) disposed between the first housing structure and the second housing structure to fold or unfold the first housing structure and the second housing structure; a flexible display (e.g., the display 100) exposed through at least a portion of a first surface of the foldable housing; a battery (e.g., the battery 540) disposed inside the second housing structure such that a partial surface thereof is adjacent to the hinge structure; and a battery plate (e.g., the battery plate 550) disposed between the battery and the flexible display, wherein the battery plate may include a first surface (e.g., the first surface 551) parallel to the first surface of the foldable housing; a first fastening part (e.g., the first fastening part 552) aligned with the first surface of the battery plate and coupled to a first surface (e.g., the 1-1 surface 520-1) of the second housing structure; a second surface (e.g. the second surface 553) perpendicular to the first surface of the battery plate and adjacent to the hinge structure; and a second fastening part (e.g., the second fastening part 554) perpendicular to the second surface of the battery plate and coupled to a second surface (e.g., the second surface 520-3) of the second housing structure opposite to the first surface thereof.

The second surface of the battery plate may be coupled to a third surface (e.g., the third surface 520-4) of the second housing structure perpendicular to the first surface of the second housing structure.

The first fastening part may couple the battery plate to the first surface of the second housing structure by at least one of a welding manner, a bonding manner, a screw fastening manner, or a covering manner.

A welding region (e.g., the welding region 701) of the first fastening part may be formed to have a stepped portion (e.g., stepped portion 52) with the first surface of the battery plate to prevent slag overflow.

A screw fastening region (e.g., the screw fastening region 703) of the first fastening part may be formed to have a stepped portion (e.g., stepped portion 53) such that a fastened screw has a height lower than the first surface of the battery plate.

A covering region (e.g., the covering region 704) of the first fastening part may be located between the hinge structure and the second housing structure.

An adhesive region (e.g., the adhesive region 702, the adhesive region 802) of the first fastening part may be attached to the second housing structure by thermocompression tape.

The first fastening part may be coupled such that the first surface of the battery plate has a designated gap (e.g., the gap 1003) with the second housing structure to prevent overpressing.

The second fastening part may couple the battery plate to the second surface of the second housing structure by at least one of the bonding manner or the screw fastening manner.

The second surface of the battery plate may be coupled to the third surface of the second housing structure by at least one of a hook manner, a bonding manner, or a screw fastening manner.

The first surface of the battery plate may include holes.

According to an embodiment, an electronic device (e.g., the electronic device 1000) may include a foldable housing (e.g., the foldable housing 500) including a first housing structure (e.g., the first housing structure 510) and a second housing structure (e.g., the second housing structure 520); a hinge structure (e.g., the hinge structure 531) disposed between the first housing structure and the second housing structure to fold or unfold the first housing structure and the second housing structure; a flexible display (e.g., the display 100) exposed through at least a portion of a first surface of the foldable housing; a battery (e.g., the battery 540) disposed inside the second housing structure such that a partial surface thereof is adjacent to the hinge structure; and a battery plate (e.g., the battery plate 550) disposed between the battery and the flexible display, wherein the battery plate may comprise: a first surface (e.g., the first surface 551) parallel to the first surface of the foldable housing; a first fastening part (e.g., the first fastening part 552) aligned with the first surface of the battery plate and coupled to a first surface (e.g., the 1-1 surface 520-1) of the second housing structure; and a second surface (e.g. the second surface 553) perpendicular to the first surface of the battery plate, adjacent to the hinge structure, and coupled to a second surface (e.g., the third surface 520-4) of the second housing structure perpendicular to the first surface thereof.

The second surface of the battery plate may be coupled to the second surface of the second housing structure by at least one of a hook manner, a bonding manner, or a screw fastening manner.

The first fastening part may couple the battery plate to the first surface of the second housing structure by at least one of a welding manner, a bonding manner, a screw fastening manner, or a covering manner.

A welding region (e.g., the welding region 701) of the first fastening part may be formed to have a stepped portion (e.g., stepped portion 52) with the first surface of the battery plate to prevent slag overflow.

A screw fastening region (e.g., the screw fastening region 703) of the first fastening part may be formed to have a stepped portion (e.g., stepped portion 53) such that a fastened screw has a height lower than the first surface of the battery plate.

A covering region (e.g., the covering region 704) of the first fastening part may be located between the hinge structure and the second housing structure.

An adhesive region (e.g., the adhesive region 702, the adhesive region 802) of the first fastening part may be attached to the second housing structure by thermocompression tape.

The first fastening part may be coupled such that the first surface of the battery plate has a designated gap (e.g., the gap 1003) with the second housing structure to prevent overpressing.

The first surface of the battery plate may include holes.

If one surface (e.g., the front surface) of a housing, to which a battery plate is attached, does not include a sufficient attachment area, a portion of the battery plate in the corresponding region is bent to provide a coupling structure for the battery plate, which allows the battery plate to be attached to another surface (e.g., a side surface and/or the rear surface) of the housing. Accordingly, the electronic device may secure a battery mounting space and secure a coupling strength of the battery plate.

The electronic device may be one of various types of electronic devices. The electronic devices may include, for example, a portable communication device (e.g., a smartphone), a computer, a portable multimedia device, a portable medical device, a camera, a wearable device, or a home appliance. However, the electronic devices are not limited to those described above.

The embodiments of the present disclosure and the terms used therein are not intended to limit the present disclosure to particular embodiments but include various changes, equivalents, or replacements for a corresponding embodiment. With regard to the description of the accompanying drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of, the items enumerated together in a corresponding one of the phrases. As used herein, such terms as "$1^{st}$," "$2^{nd}$," "first," and "second" may be used to simply distinguish a corresponding component from another component, but does not limit the components in another aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wiredly), wirelessly, or via a third element.

As used herein, the term "module" may include a unit implemented in hardware, software, or firmware, and may be used interchangeably with other terms, for example, "logic," "logic block," "part," and "circuitry". A module may be a single integral component, or a minimum unit or part thereof, adapted to perform one or more functions. For example, a module may be implemented in a form of an application-specific integrated circuit (ASIC).

Embodiments set forth herein may be implemented as software (e.g., a program) including one or more instructions that are stored in a storage medium that is readable by a machine (e.g., the electronic device 1000). For example, a processor of the machine (e.g., the electronic device 1000) may invoke at least one of the one or more instructions stored in the storage medium, and execute the one or more instructions, with or without using one or more other components under the control of the processor. This allows the machine to be operated to perform at least one function according to the at least one instruction invoked. The one or more instructions may include code generated by a complier or code executable by an interpreter. The machine-readable storage medium may be provided in the form of a non-transitory storage medium. Wherein, the term "non-transitory" simply indicates that the storage medium is a tangible device, but does not include a signal (e.g., an electromagnetic wave), but this term does not differentiate between where data is semi-permanently stored in the storage medium and where the data is temporarily stored in the storage medium.

A method of the present disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

While the present disclosure has been shown and described with reference to certain embodiments thereof, it will be understood by those skilled in the art that various changes in form and details may be made therein without departing from the spirit and scope of the present disclosure as defined by the appended claims and their equivalents.

What is claimed is:

1. An electronic device, comprising:
   a foldable housing comprising a first housing structure and a second housing structure;
   a hinge structure disposed between the first housing structure and the second housing structure and configured to fold or unfold the first housing structure and the second housing structure;
   a flexible display exposed through at least a portion of a first surface of the foldable housing;
   a battery disposed inside the second housing structure wherein a partial surface of the second housing structure is adjacent to the hinge structure; and
   a battery plate disposed between the battery and the flexible display,
   wherein the battery plate comprises:
   a first surface parallel to the first surface of the foldable housing;
   a first fastening part aligned with the first surface of the battery plate and coupled to a first surface of the second housing structure;
   a second surface perpendicular to the first surface of the battery plate and adjacent to the hinge structure; and
   a second fastening part perpendicular to the second surface of the battery plate and coupled to a second surface of the second housing structure opposite to the first surface of the second housing structure.

2. The electronic device of claim 1, wherein the second surface of the battery plate is coupled to a third surface of the second housing structure perpendicular to the first surface of the second housing structure.

3. The electronic device of claim 1, wherein the first fastening part is configured to couple the battery plate to the first surface of the second housing structure by at least one of welding, bonding, screw fastening, or covering.

4. The electronic device of claim 3, wherein the first fastening part comprises a welding region configured to form a stepped portion with the first surface of the battery plate to prevent slag overflow.

5. The electronic device of claim 3, wherein the first fastening part comprises a screw fastening region configured to form a stepped portion wherein a fastened screw has a height less than the first surface of the battery plate.

6. The electronic device of claim 3, wherein the first fastening part comprises a covering region between the hinge structure and the second housing structure.

7. The electronic device of claim 3, wherein the first fastening part comprises a bonding region attached to the second housing structure by a thermocompression tape.

8. The electronic device of claim 1, wherein the first fastening part is aligned with the first surface of the battery plate and configured to form a designated gap between the battery plate and the second housing structure to prevent overpressing.

9. The electronic device of claim 3, wherein the second fastening part is configured to couple the battery plate to the second surface of the second housing structure by at least one of bonding or screw fastening.

10. The electronic device of claim 2, wherein the second surface of the battery plate is coupled to the third surface of the second housing structure by at least one of hooking, bonding, or screw fastening.

11. The electronic device of claim 1, wherein the first surface of the battery plate comprises a plurality of holes.

12. An electronic device, comprising:
    a foldable housing comprising a first housing structure and a second housing structure;
    a hinge structure disposed between the first housing structure and the second housing structure and configured to fold or unfold the first housing structure and the second housing structure;
    a flexible display exposed through at least a portion of a first surface of the foldable housing;
    a battery disposed inside the second housing structure wherein a partial surface of the second housing structure is adjacent to the hinge structure; and
    a battery plate disposed between the battery and the flexible display,
    wherein the battery plate comprises:
    a first surface parallel to the first surface of the foldable housing;
    a first fastening part aligned with the first surface of the battery plate and coupled to a first surface of the second housing structure; and
    a second surface perpendicular to the first surface of the battery plate, adjacent to the hinge structure, and coupled to a second surface of the second housing structure perpendicular to the first surface of the second housing structure.

13. The electronic device of claim 12, wherein the second surface of the battery plate is coupled to the second surface of the second housing structure by at least one of hooking, bonding, or screw fastening.

14. The electronic device of claim 12, wherein the first fastening part is configured to couple the battery plate to the first surface of the second housing structure by at least one of welding, bonding, screw fastening, or covering.

15. The electronic device of claim 14, wherein the first fastening part comprises a welding region configured to form a stepped portion with the first surface of the battery plate to prevent slag overflow.

16. The electronic device of claim 14, wherein the first fastening part comprises a screw fastening region configured to form a stepped portion wherein a fastened screw has a height less than the first surface of the battery plate.

17. The electronic device of claim 14, wherein the first fastening part comprises a covering region between the hinge structure and the second housing structure.

18. The electronic device of claim 14, wherein the first fastening part comprises a bonding region attached to the second housing structure by a thermocompression tape.

19. The electronic device of claim 12, wherein the first fastening part is aligned with the first surface of the battery plate and configured to form a designated gap between the battery plate and the second housing structure to prevent overpressing.

20. The electronic device of claim 12, wherein the first surface of the battery plate comprises a plurality of holes.

* * * * *